United States Patent [19]

Hattori et al.

[11] Patent Number: 5,007,372
[45] Date of Patent: Apr. 16, 1991

[54] VACUUM DEPOSITING APPARATUS

[75] Inventors: Shintarou Hattori; Takayuki Takahagi; Akira Ishitani, all of Shiga, Japan

[73] Assignee: Research Development Corporation, Tokyo, Japan

[21] Appl. No.: 280,152

[22] Filed: Dec. 5, 1988

[30] Foreign Application Priority Data

Dec. 4, 1987 [JP] Japan .................. 62-308426
Dec. 4, 1987 [JP] Japan .................. 62-308427
Dec. 4, 1987 [JP] Japan .................. 62-308428

[51] Int. Cl.$^5$ ........................... C23C 16/00
[52] U.S. Cl. ................... 118/715; 118/719; 118/726; 156/610; 156/611; 427/248.1
[58] Field of Search ........... 118/715, 719, 726; 156/610, 611; 427/248.1

[56] References Cited

U.S. PATENT DOCUMENTS 4,606,296  8/1986  Gailliard et al. .............. 118/726

FOREIGN PATENT DOCUMENTS 53-91573   8/1978  Japan .................. 156/611
60-108400  6/1985  Japan .................. 118/726
61-161709  7/1986  Japan .................. 118/726
63-215036  9/1988  Japan .................. 118/715

OTHER PUBLICATIONS

Tsang, W. T., "Chemical Beam Epitaxy of InP and GaAs", Applied Physics Letters, vol. 45, No. 11 (Dec. 1, 1984), pp. 1234–1236.

Primary Examiner—Norman Morgenstern
Assistant Examiner—Terry J. Owens
Attorney, Agent, or Firm—Wenderoth, Lind & Ponack

[57] ABSTRACT

A vacuum depositing apparatus for forming a vapor-deposited film by evaporation of a material to be vapor deposited onto the surface of a substrate under vacuum, whereby mechanisms are provided to prevent impurities, due to contamination in the vacuum vessel or impurities caused by thermal deterioration of the material, from mixing with and contaminating the vapor-deposited film. As a mechanism for preventing impurities from mixing into the vapor-deposited film, there is provided a collimator, preferably cooled to prevent re-evaporation of the material to be vapor-deposited, once it is diffused into the vacuum vessel, and to prevent subsequent mixture of this material with the vapor deposited film, or a separation mechanism such as a valve provided between the substrate and the spouting cell to prevent contamination of the vapor-deposited film between the substrates and the spouting cell, or there is provided a spouting cell containing a specimen container unsealing mechanism, operable under a vacuum, which unsealing mechanism permits a gas to be introduced from the specimen container into the spouting cell.

10 Claims, 8 Drawing Sheets

VACUUM DEPOSITING APPARATUS

FIELD OF THE INVENTION

The present invention relates to a vacuum depositing apparatus for forming a vapor-deposited film on the surface of a substrate under vacuum, and more particularly, to a vacuum depositing apparatus which permits prevention of the introduction, into a deposited film, of impurities resulting from contamination in the vacuum vessel or impurities resulting from thermal deterioration of the material to be vapor-deposited.

DESCRIPTION OF THE PRIOR ART

A thin film comprising converted films formed by regularly arranging molecules, whether the molecules are formed by an inorganic or organic compound, on the surface of a substrate, capable of providing novel properties and uses, not observed in pure bulk crystals, is attracting the general attention as a new electronic material. These novel properties include nonlinear optical effects, optical memory and photo-current converting properties.

Such thin films are prepared by the vacuum deposition method which comprises placing a spouting cell containing a material to be vapor-deposited, on a heater, together with a substrate to be applied with vapor deposition set in a vacuum vessel, and causing vapor deposition onto the substrate by evaporating the material to be vapor-deposited through heating of the heater (see, for example, K. Inaoka: Surface, vol. 2, p. 61–75, 1986). Another method of preparing such thin films is by the molecular beam epitaxial method (MBE method), or which comprises placing a spouting cell charged with a substrate to be applied with vapor deposition and a material to be vapor-deposited in an ultra-high vacuum vessel, heating the spouting cell to produce a flow of a molecular beam of the material to be vapor-deposited, and vapor-depositing this molecular beam flow onto the substrate to be applied with vapor deposition (see for example, M. Hara: Preprint for the 8th Optical Fiber Conference, p. 13–16, July 23, 1987).

As a vacuum depositing apparatus known publicly for applying these methods, there is indicated for example, as shown in FIG. 7(a), a vacuum depositing apparatus comprising a vacuum vessel (114) having therein a substrate holder (113) for holding a substrate (101) to be applied with vapor deposition and a spouting cell (102) for charging a material to be vapor-deposited. This vacuum vessel (114) is connected through a vacuum valve (115) to a vacuum pump (116) and also has a film thickness meter (112) and a window (119). Behind the spouting cell (102), there is provided a spouting cell heater electrode (117), outside the spouting cell fitting flange (107), together with a spouting cell temperature controlling thermocouple electrode (118), and a liquified nitrogen reservoir (111) is provided around the spouting cell (102). The conventional vacuum depositing apparatuses include one having a liquefied nitrogen reservoir also on the inner periphery of the vacuum vessel (114) as shown in FIG. 7 (b), and one having a spouting cell (102) installed below a substrate holder (113) as shown in FIG. 7(c).

When forming a vapor-deposited film by means of any of these vacuum depositing apparatuses, a gas such as air, nitrogen, argon or helium is introduced in advance into the vacuum vessel (114) of the apparatus under the atmospheric pressure. Then, the spouting cell (102) is taken out from the vacuum vessel (114) of the apparatus by removing the fitting flange (107), and the spouting cell (102) is charged with the material to be vapor-deposited. Then, the spouting cell (102) is fitted again to the vacuum vessel (114), and a baking operation is conducted while evacuating the vacuum vessel (114). Subsequently, the spouting cell (102) is heated to evaporate the materials to be vapor-deposited for laminating onto the substrate (101) to be applied with vapor deposition, which is adopted as a series of processes for forming a vapor-deposited film. The baking operation is carried out to evacuate the entire apparatus into vacuum for a long period of time while heating it to a high temperature prior to conducting the vapor depositing operation, and is indispensable for eliminating impurities such as air and moisture already adsorbing on the walls of the vacuum vessel in the above-mentioned thin film forming methods such as vacuum depositing methods and the MBE method.

However, when forming a vapor-deposited film by means of such a conventional vacuum depositing apparatus, impurities adhering to the inner walls of the vacuum vessel (114) are mixed into the material to be vapor-deposited charged in the spouting cell (102) or part of the material to be vapor-deposited is pyrolyzed and the resulting decomposed products are mixed as impurities into the material to be vapor-deposited, during the baking operation. During the following vapor deposition, therefore, these impurities evaporate, together with the material to be vapor-deposited, and are vapor-deposited onto the surface of the substrate (101) to be applied with vapor deposition. It is therefore inevitable that the purity of the vapor-deposited film decreases, with disturbed molecular arrangement, and the prescribed functions to be achieved by the thin film are degraded.

When the spouting cell (102) is heated during the vapor-depositing operation to evaporate the material to be vapor-deposited, there is a problem that the evaporated material to be vapor-deposited diffuses within the vacuum vessel (114) and adheres to the inner surface of the vacuum vessel (114), from which it evaporates again, and that part of the re-evaporated material to be vapor deposited involves impurities such as air and moisture in a slight amount already adhering to the inner surface of the vacuum vessel (114) and re-deposited onto the substrate (101) during the vapor deposition of the vapor or the substrate. This degrades the purity of the vapor-deposited film formed on the surface of the substrate (101), disturbs the molecular arrangement, and often causes deterioration of the functions unique to the thin films thus-produced.

In these conventional vacuum depositing apparatuses, the spouting cell charged with the substrate to be coated by vapor deposition and the material to be vapor deposited are substantially in the same vacuum vessel. It is therefore essential to conduct a baking operation, with the spouting cell charged with the material to be vapor-deposited. This causes impurities flying from the walls of the vacuum vessel to be mixed into the material to be vapor-deposited during the baking operation, or causes part of the material to be vapor-deposited to deteriorate due to pyrolysis etc. and each decomposed material is deposited as impurities (see, for example, U. Itch, et al.: Thin Solid FIlms, vol. 121, p. 7–16 (1984). These impurities are evaporated simultaneously with the material to be vapor-deposited and simultaneously from laminated layers on the substrate to be applied with vapor deposition. This disturbs the molecular arrangement, and causes a decrease in the thin film purity and the functions intrinsic to thin films.

A material having a melting point lower than the baking temperature, violently boils in the spouting cell during the baking operation, in the conventional depositing apparatus, and scatters throughout the entire internal space of the apparatus, involving a substance in the form of fine particles which is not evaporated, thereby emptying the interior of the spouting cell. This makes it practically impossible to conduct vapor deposition of a low-melting-point material.

In addition, in the conventional vacuum depositing apparatus, it is necessary to break the vacuum of the entire apparatus to introduce air or a gas such as nitrogen, argon or helium into the vacuum vessel for the purpose of replenishing the material to be vapor-deposited to the spouting cell. This requires a baking operation, which involves the problems as described above, to be carried out again each time the material to be vapor-deposited is replenished to the spouting cell.

Furthermore, in these conventional vacuum depositing apparatuses, the material to be vapor-deposited which is evaporated in the spouting cell, diffuses and adheres throughout the entire inner walls of the vacuum depositing vessel in addition to the target substrate to be vapor deposited during the vapor depositing operation, since the target substrate and the spouting cell charged with the material to be vapor-deposited opposed to each other in the vacuum vessel. The thus adhering material to be vapor-deposited involves impurities such as air and moisture in a slight amount which have already been sucked in the vacuum vessel, and is evaporated again. Laminated layers on the substrate to be subjected to vapor deposition to form a film on said substrate, as formed by the material to be vapor-deposited simultaneously with these impurities, again cause deterioration of the purity of the formed thin film and disturb molecular arrangement, thus impairing the prescribed functions intrinsic to thin films to be achieved.

In addition to the conventional vapor depositing apparatuses shown in FIGS. 7(a) to 7(c), also in a conventional vacuum depositing apparatus in which two or more materials to be vapor-deposited are charged in a plurality of spouting cells and vapor-deposited films of different materials are alternately formed on a substrate to be applied with vapor deposition by alternately opening and closing the shutters provided at the tips of the cells, there has been a difficulty of mixing impurities into the thus formed films. More particularly, during lamination of the vapor-deposited films composed of some specific material while conducting the above-mentioned shutter operation, a different material having already adhered to the inner walls of the vacuum vessel is gradually evaporated from the interior of the vacuum vessel and simultaneously deposited onto the substrate to vapor deposition. This causes deterioration of the purity of the thin film thus-formed and disturbs the molecular arrangement, thus impairing the prescribed functions intrinsic to the thin films thus-produced.

OBJECT OF THE INVENTION

An object of the present invention is therefore to provide a novel vacuum depositing apparatus which enables one to overcome the defects of the conventional methods as described above and prevent mixture of impurities into a formed film, resulting from redeposition of the material having diffused in and adhered to the interior of the vacuum vessel, and thus permits the formation of a vapor-deposited film free from impurities.

Another object of the present invention is to provide a vacuum depositing apparatus which prevents mixture, into the material to be vapor-deposited, of impurities resulting the contamination in the vacuum vessel and impurities resulting from the thermal deterioration of the material to be vapor-deposited itself.

Further, another object of the present invention is to provide a vacuum depositing apparatus which permits vapor deposition of a material having a melting point lower than the baking temperature or a material easily susceptible to thermal decomposition.

According to the present invention, as an apparatus permitting achievement of these objects, there is provided a vacuum depositing apparatus which comprises one or more substrates to be with vapor deposited, and one or more spouting cells charged with one or more kinds of material to be vapor-deposited, arranged in a vacuum vessel, and is equipped with a means to prevent mixture of impurities into the vapor-deposited film.

Now, the vacuum depositing apparatus of the present invention is described further in detail with reference to the drawings.

BRIEF DESCRIPTION OF THE DRAWINGS

FIGS. 8(a) and 6(b) are enlarged sectional views illustrating, in different directions, the portion near the spouting cell of the vacuum depositing apparatus shown in FIG. 5, and FIGS. 7(a) to 7(c) are schematic sectional views illustrating typical conventional vacuum depositing apparatuses.

DETAILED DESCRIPTION OF THE PREFERRED EMBODIMENTS

The vacuum depositing apparatus of the present invention is characterized in that it comprises one or more substrates to be applied with vapor deposited, and one or more spouting cells charged with one or more kinds of material to be vapor-deposited, arranged in a vacuum vessel and equipped with a means to prevent mixture of impurities into the vapor-deposited film, and more preferably, having one or more collimators installed between the substrate to be applied with vapor deposition and the spouting cell along the straight line connecting the center of the spouting cell and the center of the substrate to be vapor deposited.

The vapor depositing apparatus of the present invention provided with collimators is based on the following finding of the present inventor. In order to prevent mixture of the material to be vapor-deposited having once diffused in the vacuum vessel into the vapor-deposited film through re-evaporation, it is effective to impart a strong directivity to the flow of the material to be vapor-deposited from the spouting cell charged therewith toward the substrate to be applied with vapor deposition so as to prevent the material to be vapor-deposited from adhering to unnecessary portions.

Directivity can be imparted to the flow of the evaporated material to be vapor-deposited from the spouting cell by installing a collimator having a rectifying function between the spouting cell and the substrate to be applied with vapor deposited.

In this case, the collimator should preferably be kept at a temperature lower than that of the spouting cell target substrate for the purpose of preventing re-evaporation of the material to be vapor-deposited adhering to the collimator, and for this purpose, it is desirable to cool the collimator by means of a coolant such as liquefied nitrogen. Although the collimator effectively serves for vapor deposition under conditions which the material to be vapor-deposited exhibits properties of a viscous flow, vapor-deposited operation should more preferably be carried out at a vacuum degree at which the frequency of collision between molecules of the material to be vapor-deposited in their molecular movement is sufficiently low to produce a molecular beam flow having a uniform direction of molecular movement.

Figure 1:
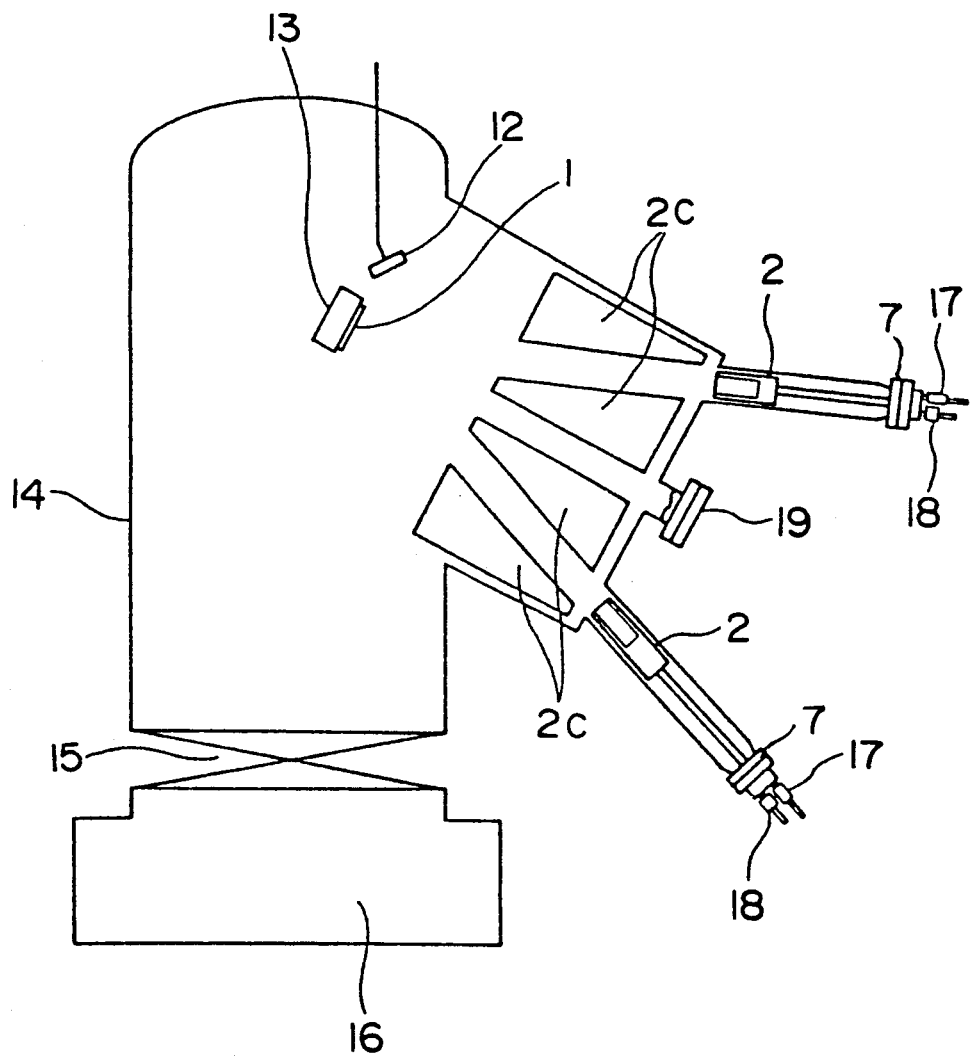
FIG. 1 is a schematic sectional view illustrating an embodiment of the vacuum depositing apparatus of the present invention provided with collimators.

The vacuum depositing apparatus of the present invention as described above may, for example, be configured as shown in FIG. 1.

Figure 2:
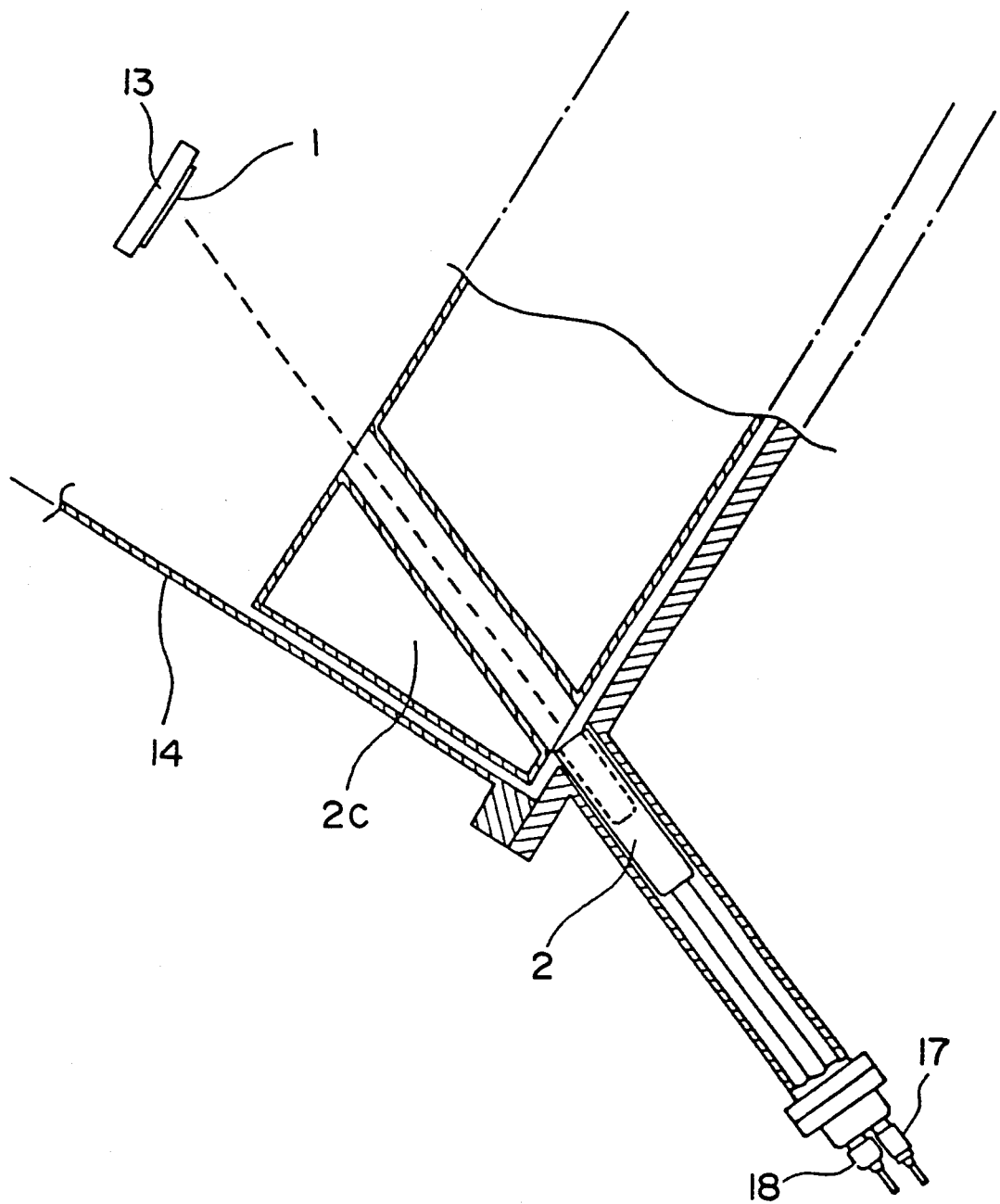
FIG. 2 is an enlarged sectional view illustrating the portion near the spouting cell of the vacuum depositing apparatus shown in FIG. 1.

The vacuum depositing apparatus shown in FIG. 1 comprises, similarly to the conventional vacuum depositing apparatuses, a substrate holder (13) holding a target substrate to form a vapor deposited film thereupon (1), and a vacuum vessel (14) containing therein a film thickness meter (12) and a spouting cell (2). A vacuum pump (16) is connected through a vacuum valve (15) to the vacuum vessel (14) which is provided with a window (19). Behind the spouting cell (2), a spouting cell heater electrode (17) is installed outside a spouting cell fitting flange (7), together with a spouting cell temperature controlling thermocouple electrode (18). Unlike the conventional ones, this vacuum depositing apparatus has a collimator (2c) along the straight line connecting the spouting cell (2) and the substrate (1) to be applied with vapor deposition. FIG. 2 is an enlarged view of the portion near the spouting cell (2) in this case.

According to this vacuum depositing apparatus, during vapor depositing operation, the materials to be vapor-deposited charged in the spouting cell (2) are evaporated by heating and begins molecular movement in free directions. Among the molecules of the material to be vapor-deposited, those making molecular movement in directions other than that to the target substrate (1) collide with the wall of the collimator cooled by means of a coolant such as liquefied nitrogen, are captured thereby, and adheres thereto. On the other hand, molecules of the material to be vapor-deposited having passed through without colliding with the wall of the collimator cooled by a coolant, such as liquefied nitrogen, form a beam directed toward the substrate (1) to be applied with vapor deposition. Molecules of the material to be vapor-deposited in this beam do not diffuse in the vacuum vessel (14), so that contamination of the thin film formed by vapor deposition on the substrate (1) is not substantially caused by re-evaporation from the inner surface of the vacuum vessel (14).

In the vacuum depositing apparatus provided with a collimator as described above, it is possible to prevent contamination of the thin film formed on the substrate, which is caused by adherence and re-evaporation of the material to be vapor-deposited onto the inner walls of the vacuum vessel. The apparatus is therefore particularly suitable for vacuum deposition of an organic compound which tends to cause contamination problems.

Furthermore, the vacuum depositing apparatus of the present invention may comprise, in addition to those described above, one or more separation mechanisms between the target substrate and the spouting cell as mechanisms for preventing the mixture of impurities into the vapor-deposited film. This permits charging substantially under the atmospheric pressure the spouting cell with the material to be vapor-deposited, while the target substrate is under a vacuum.

The vacuum depositing apparatus of the present invention having a separation mechanism provided between the target substrate and the spouting cell is based on the following finding of the present inventor. More particularly, the problems in the conventional vacuum depositing apparatus as to baking operation can be solved by adopting a structure in which the spouting cell charged with the material to be vapor-deposited is housed in a vacuum vessel separate from that of the main body of the apparatus housing the substrate to be applied with vapor deposition so as to prevent the heat during the baking operation from communicating to the vacuum vessel containing the spouting cell in the state in which the material to be vapor deposited is set in the spouting cell.

Another finding was as follows. The material to be vapor-deposited can be replenished without breaking the vacuum of the entire apparatus by providing a separation mechanism such as a vacuum valve between the vacuum vessel of the main body of the apparatus and the above-mentioned vacuum vessel housing the spouting cell, releasing only the vacuum vessel containing the spouting cell, while maintaining vacuum of the vacuum vessel housing the target substrate, to replenish the material to be vapor-deposited, evacuating this portion again to vacuum after replenishing, and connecting that portion again to the vacuum vessel housing the substrate to be applied with vapor deposition. In this case, the effect of impurities, such as air and moisture adhering in the vacuum vessel containing the spouting cell to a vapor-deposited film, can be disregarded by selecting a sufficiently smaller volume of the vacuum vessel containing the spouting cell than that of the vacuum vessel housing the substrate to be applied with vapor deposition. It is therefore possible to substantially eliminate the necessity of the second baking operation of the vacuum vessel for the main body of the vacuum depositing apparatus housing the substrate to be applied with vapor deposition.

It is desirable, as in the vacuum depositing apparatus of the present invention provided with a collimator described above, to make it possible for the material to be vapor-deposited to form a molecular beam flow from the spouting cell toward the substrate to be applied with vapor deposition.

Figure 3:
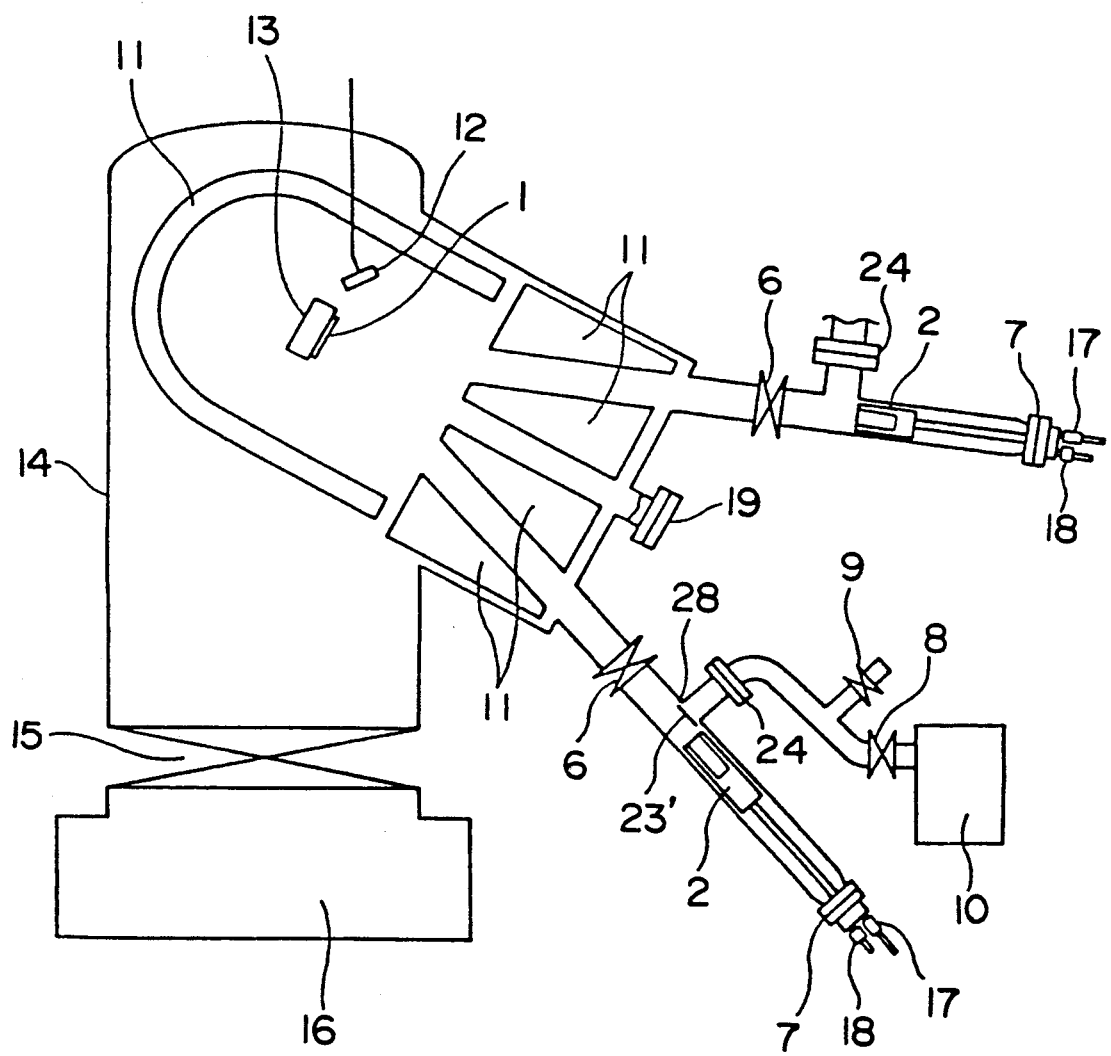
FIG. 3 is a schematic sectional view illustrating an embodiment of the vacuum depositing apparatus of the present invention equipped with a separation mechanism between the substrate to be applied with vapor deposited and the spouting cell.

This vacuum depositing apparatus of the present invention may be, for example, configured as shown in FIG. 3.

The vacuum depositing apparatus shown in FIG. 3 is configured in substantially a manner similar to the main body of the apparatus shown in FIG. 1, and the common components are marked with the same reference numerals.

Figure 4:
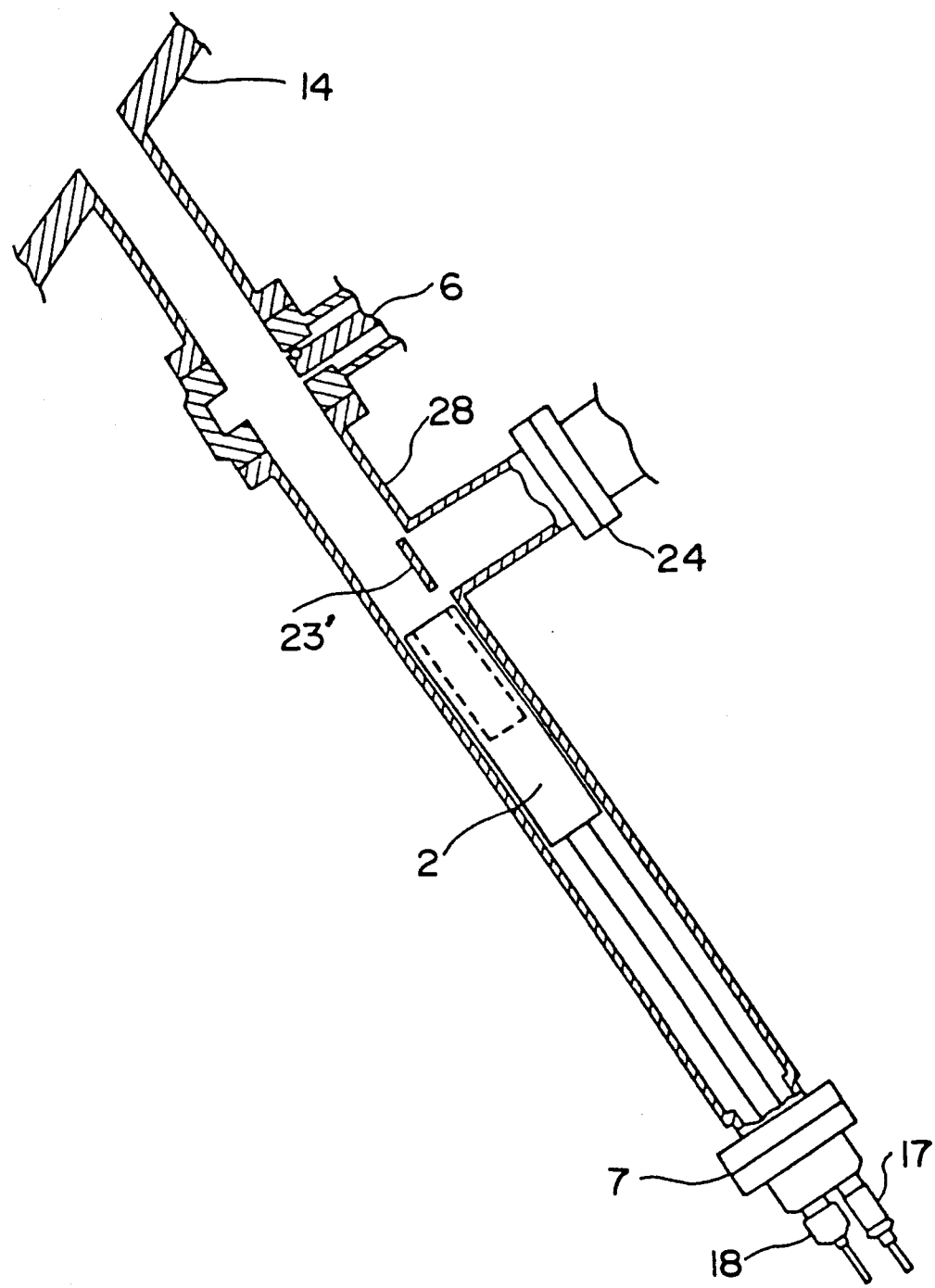
FIG. 4 is an enlarged sectional view illustrating the portion near the spouting cell of the vacuum depositing apparatus of the present invention shown in FIG. 3.

This vacuum depositing apparatus have separate vacuum vessels: a vacuum vessel (14) of the main body of the apparatus, which houses a substrate (1) to be applied with vapor deposition, and a vacuum vessel (28) housing a spouting cell (2) separated by a vacuum valve (6). Separately from the vacuum vessel (14) of the main body, a leak valve (9), a vacuum valve (8) and a vacuum pump (10) are connected through a vacuum evacuation pipe fitting flange (24) to the vacuum vessel (28) housing the spouting cell (2). A baffle board (23') is provided at each of the branches of the vacuum vessel (28) to the leak valve (9) and the like. FIG. 4 is an enlarged view illustrating the portion near the spouting cell (2). In the vacuum depositing apparatus shown in FIGS. 3 and 4, a liquified nitrogen reservoir (11) is provided so as to surround the substrate (1) to be applied with vapor deposition within the vacuum vessel (14), and a liquefied nitrogen reservoir (11) is provided also around the path between the substrate (1) and the spouting cell (2). A collimator (2c) may be installed, as shown in FIG. 1, between the substrate (1) and the spouting cell (2).

In this vacuum depositing apparatus, when conducting a vacuum deposition prior to charging the spouting cell (2) with the material to be vapor-deposited, all the vacuum vessels (14), (28) of the vacuum depositing apparatus are subjected in advance to a baking operation comprising heating them to a high temperature and evacuating them to a vacuum. Then, the leak valve (9) is opened, in the state in which the vacuum valve (6) is closed and the vacuum vessel (14) of the main body of the apparatus is kept in a vacuum, to introduce air or a gas such as nitrogen, argon or helium only into the vacuum vessel (28) housing the spouting cell (2) so as to bring the pressure to atmospheric pressure. Then, the spouting cell (2) is taken out from the vacuum vessel (28) by removing the spouting cell fitting flange (7). Subsequently, the spouting cell (2) is charge with the material to be vapor-deposited and mounted again in the vacuum vessel (28). Then, the leak value (9) is closed, and the vacuum vessel (28) housing the spouting cell (2) is evacuated to vacuum by opening the vacuum valve (8). The vacuum valve (6) is then opened, and the spouting cell (2) is heated under prescribed conditions to conduct vapor deposition onto the substrate (1).

In the vacuum depositing apparatus of the present invention, thus provided with the separation mechanism between the target substrate to be applied with vapor deposition and the spouting cell, vacuum deposition can be conducted without exposing the material to be vapor-deposited to high temperature at all during baking operation. It is therefore particularly suitable for vacuum deposition of a material susceptible to thermal decomposition or a material having a melting point lower than the baking temperature, and more particularly for vacuum deposition of organic compounds.

In addition to those described above, the vacuum depositing apparatus of the present invention may be provided with one or more spouting cells each equipped with a specimen unsealing means operable under vacuum as a further different means to prevent impurities from mixing into the vapor-deposited film.

More specifically, the present inventor considered that the problems in the conventional vacuum depositing apparatus were caused by the fact that the material to be vapor-deposited was charged in an exposed state in the spouting cell and the baking operation carried out in this state. He found that this difficulty could be solved, apart from the above-mentioned solution of installing a separation mechanism between the substrate and the spouting cell, by sealing the material to be vapor-deposited in a tightly enclosed container in advance, carrying out the baking operation in the state in which the spouting cell was charged with this container, and then conducting vapor deposition after unsealing the enclosed container charged with the material to be vapor-deposited. The tightly enclosed container in this case should preferably be made, at least partly, of glass or plastics, such as a glass ampul. In this case, the pressure in the enclosed container to contain the material to be vapor-deposited may be at the atmospheric pressure, but should preferably be at a reduced pressure or under substantially a vacuum.

Also in the above-mentioned configuration, it is desirable, as in the vacuum depositing apparatus of the present invention provided with a collimator described above, to make it possible for the material to be vapor-deposited to form a molecular beam flow from the spouting cell toward the substrate to be applied with vapor deposition.

Figure 5:
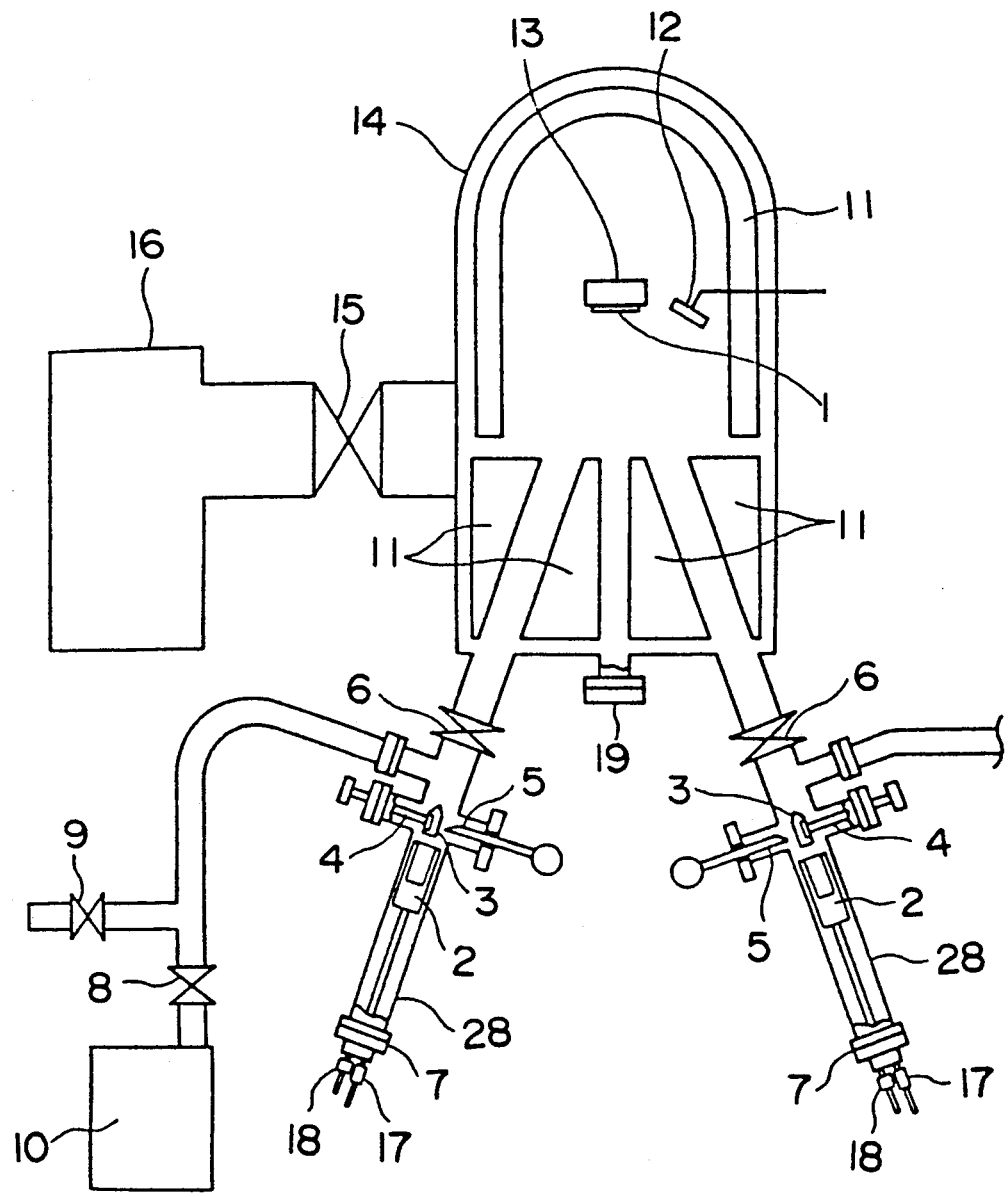
FIG. 5 is a schematic sectional view illustrating an embodiment of the vacuum depositing apparatus of the present invention provided with a specimen unsealing means.
Figure 6A:
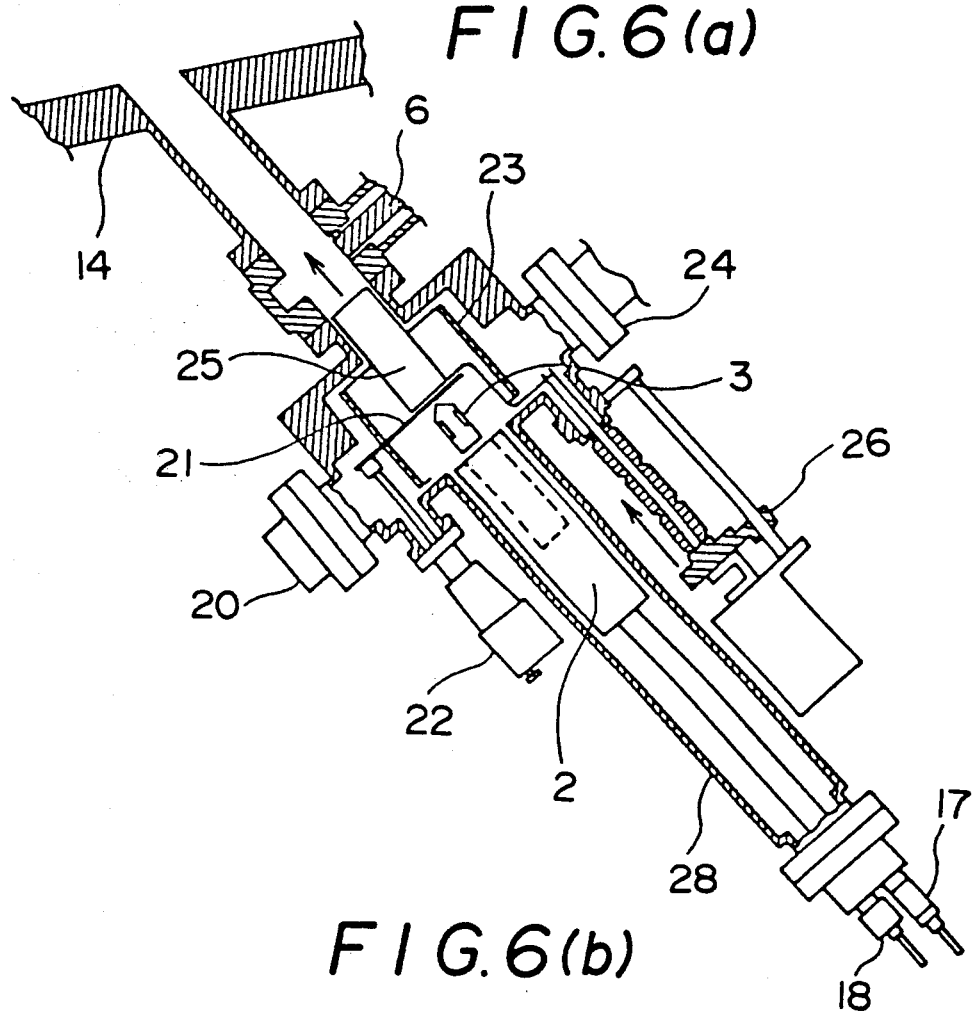
Figure 6B:
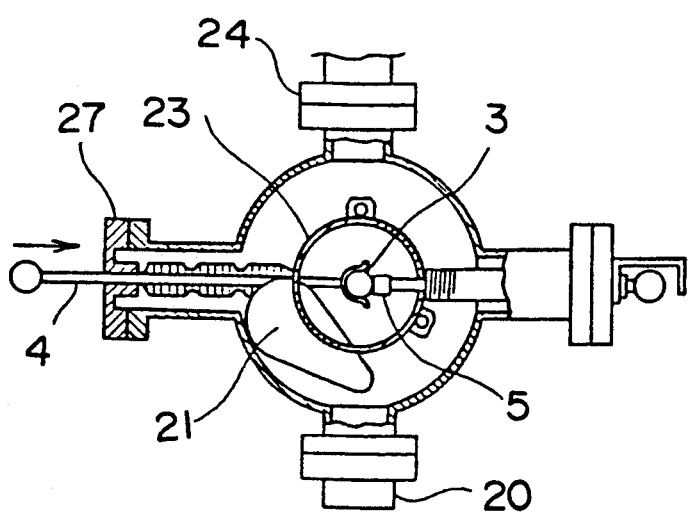
Figure 7A:
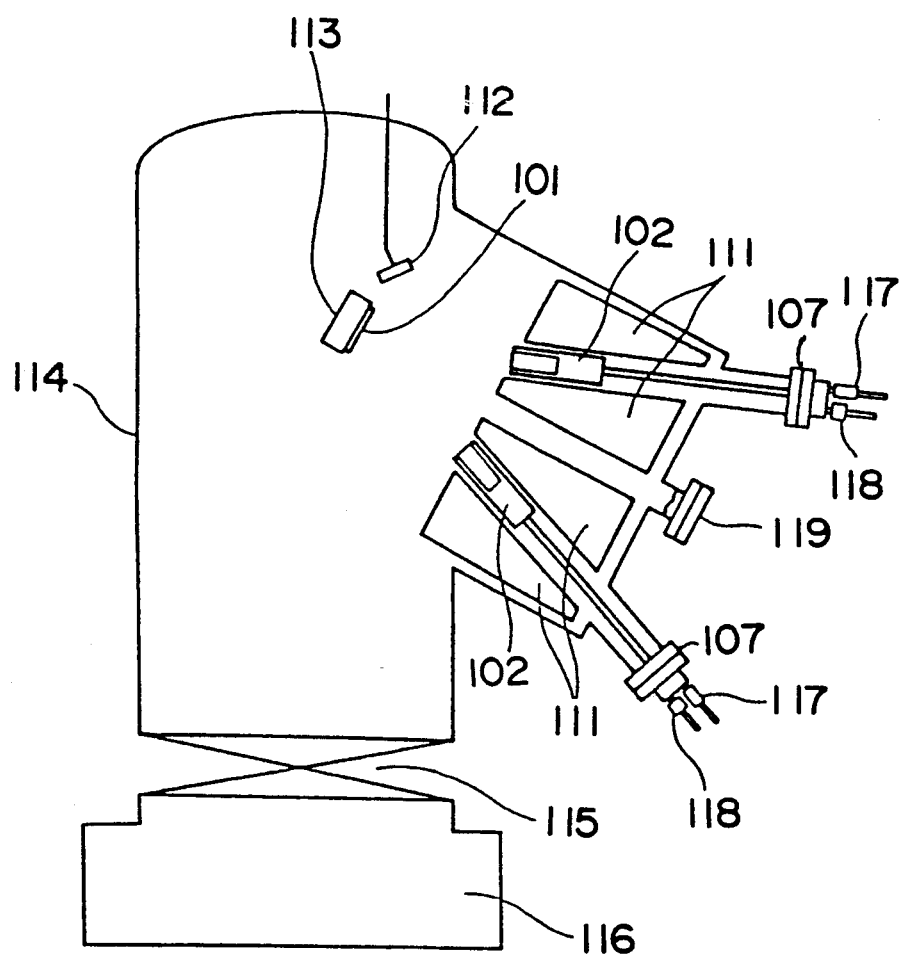
Figure 7B:
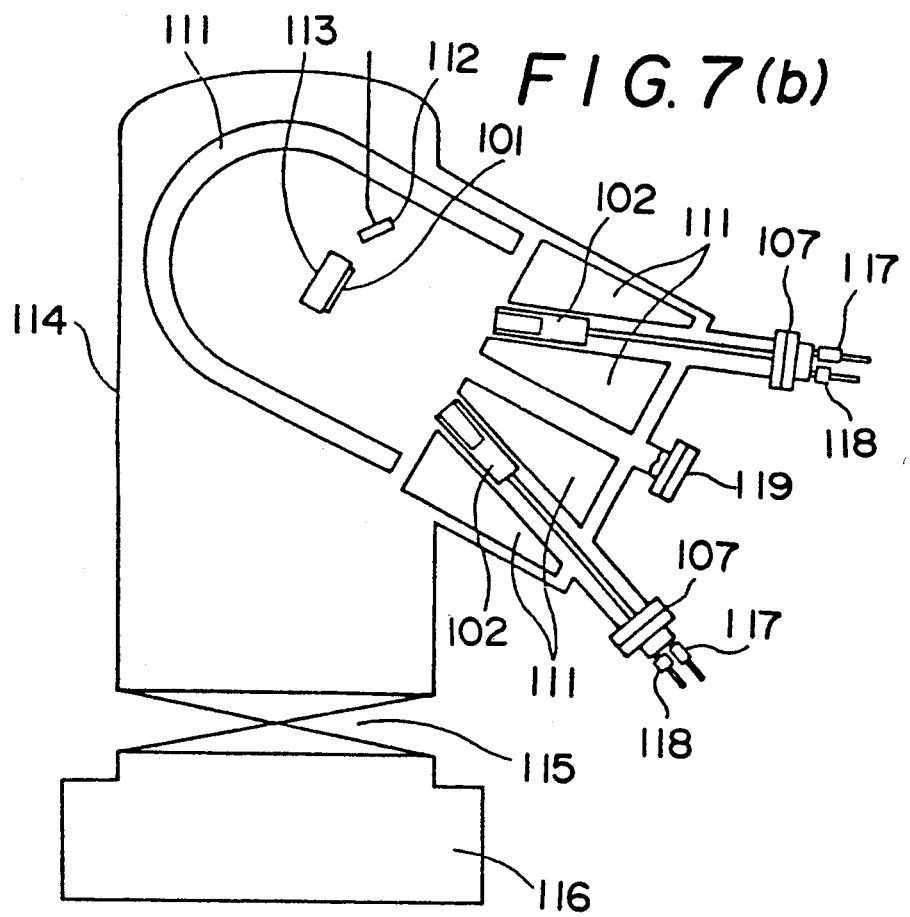
Figure 7C:
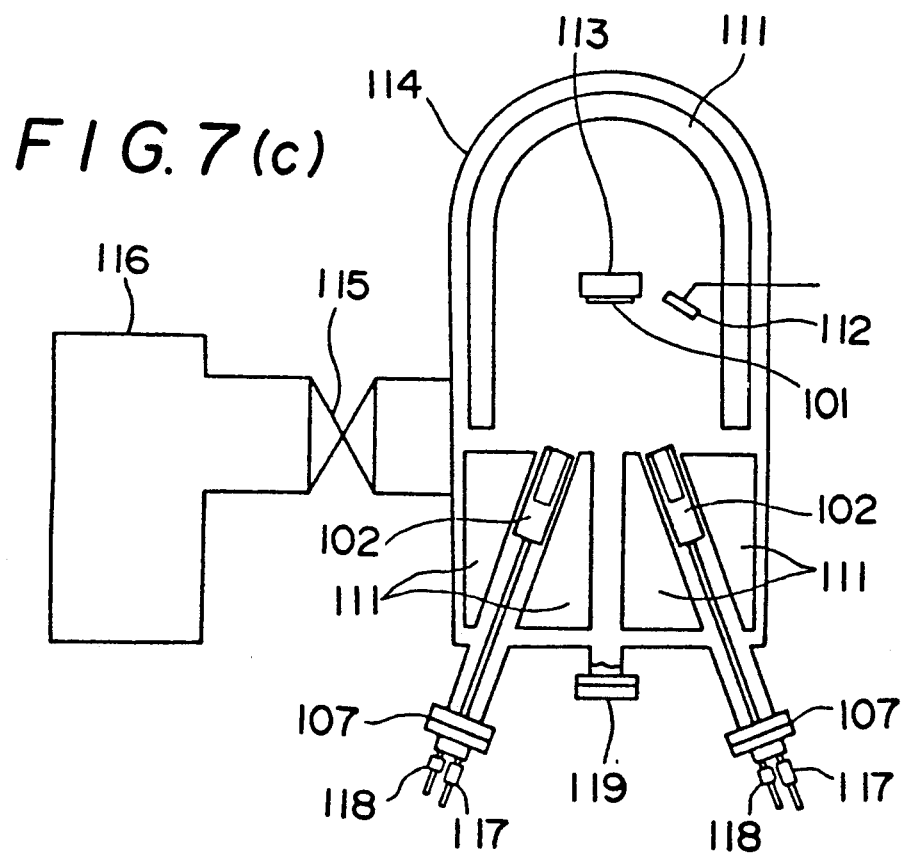

Such a vacuum depositing apparatus of the present invention may be, for example, configured as shown in FIG. 5. FIGS. 6(a) and 6(b) are enlarged sectional views in different directions of the portion near the spouting cell in this configuration of the apparatus respectively.

This vacuum depositing apparatus has a construction substantially similar to that of the vacuum depositing apparatus shown in FIG. 3 above as to the main body, except that a spouting cell (2) is provided below the substrate (1), and the same reference numerals are given to common components. More specifically, this vacuum depositing apparatus has separate vacuum vessels: a vacuum vessel (14) of the main body of the apparatus housing a substrate (1) to be applied with vapor deposition, and another vacuum vessel (28) housing a spouting cell (2), as separated by vacuum valve (6). The spouting cell (2) of this vacuum depositing apparatus is equipped with a specimen sealing container (3), a service sealing container holder (4), and a specimen container unsealing means (5), and around these means, a window (20), a projecting shutter (21), a shutter operating knob (22), a specimen container fragment receptacle (23), a valve protecting pipe (25), a valve protecting pipe operating knob (26), and a specimen container port (27) are provided. Around the path between the substrate (1) and the spouting cell (2), a liquefied nitrogen reservoir (11) is provided as in the apparatus shown in FIG. 3, whereas a collimator (2c) may be provided as in that shown in FIG. 1.

When conducting vacuum deposition by means of such a vacuum depositing apparatus, the entire vacuum depositing apparatus (14) is heated to high temperature, prior to charging the spouting cell (2) with the material to be vapor-deposited, to conduct baking operation for evacuation to vacuum. Then, the vacuum valve (6) is closed. With the vacuum vessel (14) of the main body of the apparatus kept in vacuum, the leak valve (9) is opened to introduce a gas such as air, nitrogen, argon or helium only into the vacuum vessel (28) containing the spouting cell (2) to atmospheric pressure, and the flange of the specimen container port (27) is opened to mount the specimen sealing container (3) containing the material to be vapor-deposited above the spouting cell (2). Subsequently, the leak valve (9) is closed, and then the vacuum valve (8) is opened to evacuate the vacuum vessel (28) containing the spouting cell (2) to produce a vacuum. Baking operation is applied only to this vacuum vessel (28). After completion of the baking operation, the specimen sealing container (3) is unsealed by pushing the tip of the knife at the leading end of the specimen container unsealing means (5) to the specimen sealing container (3) containing the material to be vapor-deposited, and the spouting cell (2) is charged with the specimen. Then, the vacuum valve (6) is opened, and the vacuum valve protecting pipe (25) is moved to the opening of the vacuum separation valve (6). Subsequently, the protecting shutter (21) is opened and the spouting cell (2) is heated under prescribed conditions to conduct vapor deposition onto the substrate (1) to be applied with vapor deposition.

In the vacuum depositing apparatus of the present invention having the spouting cell provided with the specimen container unsealing means operable under vacuum, the materials to be vapor-deposited is never exposed to impurities flying around during the baking operation. It is therefore possible to maintain the purity of the material to be vapor-deposited deposited, and hence to form a high-grade vapor-deposited film. According to this vacuum depositing apparatus, furthermore, a material having a melting point lower than the baking temperature can be vacuum-deposited. This apparatus is therefore effective also in improving the quality of a vapor-deposited organic film.

Now, the present invention will be further described in detail by means of examples in which vacuum deposition is carried out by use of the vacuum depositing apparatus of the present invention. Needless to say, the present invention is not limited to the examples represented below.

EXAMPLE 1

With the use of the apparatus shown in FIGS. 1 and 2, the compounds (1) to (3) shown in Table 1 were placed as the materials to be vapor-deposited in an amount of 0.2 gr., respectively, in the spouting cells, and were vapor-deposited onto the target substrate mounted on the wall of the vacuum vessel at a distance of 20 cm from the exit of the spouting cell. A 10 cm long collimator was provided between the spouting cell and the substrate so as to be in contact with the exit of the spouting cell. Spouting cells each having an inside diameter of 2 cm were employed. The thickness of the thus formed film was assessed by means of a quartz oscillator type film thickness monitors at two positions: one being at the fitting position of the substrate and the other being at the inner wall of vacuum vessel at a distance of 10 cm above from the center of the fitting position of the substrate. Vapor depositing conditions and the results are shown in Table 2.

As is evident from Table 2, none of the material to be vapor-deposited adheres to the inner walls of the vacuum vessel.

TABLE 1

| No. | Chemical structure | Name |
|---|---|---|
| (1) | (structure) | TCNQ |
| (2) | (structure) | Cyanine dye |
| (3) | (structure) | Merocyamine dye |
| (4) | (structure) | TTF |
| (5) | (structure) | Quinizarin |
| (6) | (structure) | Anthracene |

TABLE 2

| | Film thickness | | Vapor depositing condition | |
|---|---|---|---|---|
| Compound | Substrate position | Inner wall of vacuum vessel | Spouting temperature | Pressure |
| (1) | 410 Å | 0 Å | 100° C. | $10^{-8}$ Torr |
| (2) | 221 Å | 0 Å | 250° C. | $10^{-7}$ Torr |
| (3) | 205 Å | 0 Å | 200° C. | $10^{-8}$ Torr |

EXAMPLE FOR COMPARISON 1

With the use of a conventional apparatus, the above-mentioned compounds (1) to (3) were placed as the materials to be vapor-deposited in an amount of 0.2 gr., respectively, in the spouting cells, and were vapor-deposited onto the target substrate to be mounted on the wall of the vacuum vessel at a distance of 20 cm from the exit of the spouting cell. Spouting cells each having an inside diameter of 2 cm were employed as in Example 1. The thickness of the film was assessed by means of quartz oscillator type film thickness monitored at two positions: one being at the fitting position of the substrate and the other being at the inner wall of vacuum vessel at a distance of 10 cm above from the center of the fitting position of the substrate. A vapor depositing operation was carried out under the conditions shown in Table 3. The results are shown in Table 3.

The results shown in Table 3 suggests that there was a serious adherence to the inner walls of the vacuum vessel.

TABLE 3

| | Film thickness | | Vapor depositing condition | |
|---|---|---|---|---|
| Compound | Substrate position | Inner wall of vacuum vessel | Spouting temperature | Pressure |
| (1) | 400 Å | 220 Å | 100° C. | $10^{-8}$ Torr |

TABLE 3-continued

| Compound | Film thickness | | Vapor depositing condition | |
|---|---|---|---|---|
| | Substrate position | Inner wall of vacuum vessel | Spouting temperature | Pressure |
| (2) | 232 Å | 150 Å | 250° C. | $10^{-7}$ Torr |
| (3) | 212 Å | 124 Å | 200° C. | $10^{-8}$ Torr |

EXAMPLE 2 with the use of the apparatus shown in FIGS. 3 and 4, the compounds (1) and (3) shown in Table 1 above were placed as the materials to be vapor-deposited in an amount of 0.2 gr., respectively, into the spouting cell, and the melting point was measured before and after the baking operation. The baking operation was carried out under conditions including vacuum of about $10^{-8}$ Torr and a temperature of 250° C. for eight hours. The values of the melting point shown for these compounds were visually read from a mercury thermometer while heating a silicone oil bath by dipping a specimen sealed in a glass capillary tube into the silicone oil bath. The result are shown in Table 4.

TABLE 4

| Compound | Melting point before baking | Melting point after baking |
|---|---|---|
| (1) | 287° C. | 287° C. |
| (2) | 272° C. | 272° C. |
| (3) | 270° C. | 270° C. |

EXAMPLE FOR COMPARISON 2 with the use of a conventional vacuum depositing apparatus, the compounds (1) to (3) as described above were placed as the materials to be vapor-deposited in an amount of 0.2 gr., respectively, into the spouting cell, and a baking operation was carried out. The baking conditions were the same as those in Example 2: i.e. a vacuum of about $10^{-8}$ Torr and temperature of 250° C. for eight hours. The values of the melting points of these compounds were visually read, as in Example 2, from a mercury thermometer while heating a silicone oil bath by dipping a specimen sealed in a glass capillary tube into the silicone oil bath. The results are shown in Table 5.

TABLE 5

| Compound | Melting point before baking | Melting point after baking |
|---|---|---|
| (1) | 287° C. | 265° C. |
| (2) | 272° C. | 252° C. |
| (3) | 270° C. | 262° C. |

In this case, there was a drop in the melting point because of the presence of intermixed thermal decomposition products of the material to be vapor-deposited.

EXAMPLE 3

The compounds (4) to (6) shown in Table 1 above were placed as the materials to be vapor-deposited in an amount of 0.2 gr., respectively, into the spouting cell, and the melting point was measured before and after baking. Baking conditions included vacuum of $10^{-8}$ Torr and temperature of 250° C. for eight hours. The melting point of each compounds was determined in the same manner as in Example 2. The results are shown in Table 6.

TABLE 6

| Compound | Melting point before baking | Melting point after baking |
|---|---|---|
| (4) | 119° C. | 119° C. |
| (5) | 200° C. | 200° C. |
| (6) | 218° C. | 218° C. |

EXAMPLE FOR COMPARISON 3

With the use of a conventional vacuum depositing apparatus, the compounds (4) to (6) as described above were placed as the materials to be vapor-deposited in an amount of 0.2 gr., respectively, into the spouting cell, and a baking operation was carried out. The baking conditions were the same as those in Example 3: vacuum of about $10^{-8}$ Torr and temperature of 250° C. for eight hours. Under these conditions, the materials to be vapor-deposited in the spouting cell volatilized and nothing remained.

EXAMPLE 4

With the use of the apparatus shown in FIGS. 5 and 6(a) and 6(b), the compounds (1) to (3) shown in Table 1 above as the materials to be vapor-deposited in an amount of 0.2 gr., respectively, were vacuum-sealed in three glass ampuls, which were set in three spouting cells to conduct a baking operation. After the baking operation, these three ampuls were unsealed and the melting point was measured. The baking operation was carried out under conditions including vacuum of about $10^{-8}$ Torr and temperature of 250° C. for eight hours. The values of the melting points for these compounds were visually read from a mercury thermometer while heating a silicone oil bath by dipping a specimen sealed in a glass capillary tube into the silicone oil bath. The results are shown in Table 7.

TABLE 7

| Compound | Melting point | |
|---|---|---|
| | Before baking | After baking |
| (1) | 287° C. | 287° C. |
| (2) | 272° C. | 272° C. |
| (3) | 270° C. | 270° C. |

EXAMPLE FOR COMPARISON 4

With the use of a conventional vacuum depositing apparatus, the compounds (1) to (3) as described above were placed as the materials to be vapor-deposited in an amount of 0.2 gr., respectively, into three spouting cells, and the melting point was measured before and after baking operation. The baking conditions were the same as those in Example 4: vacuum of about $10^{-8}$ Torr and temperature of 250° C. for eight hours. The values of the melting points of these compounds were visually read, as in Example 4, from a mercury thermometer while heating a silicone oil bath by dipping a specimen sealed in a glass capillary tube into the silicone oil bath. The result is shown in Table 8.

TABLE 8

| Compound | Melting point | |
|---|---|---|
| | Before baking | After baking |
| (1) | 287° C. | 265° C. |
| (2) | 272° C. | 252° C. |
| (3) | 270° C. | 262° C. |

In this case, there was a drop of the melting point because part of the three materials to be vapor-deposited was evaporated during baking and mixed into other materials to be vapor-deposited.

EXAMPLE 5

The compounds (4) to (6) shown in Table 1 above as the materials to be vapor-deposited in an amount of 0.2 gr., respectively, were vacuum-sealed into three glass ampuls, which were set in three spouting cells to conduct baking operation. Then, the melting point after baking was measured by unsealing the ampuls. Baking conditions included vacuum $10^{-8}$ Torr and temperature of 250° C. for eight hours. The melting point of each compounds was determined in the same manner as in Example 4. The results are shown in Table 9.

TABLE 9

| Compound | Melting point | |
|---|---|---|
| | Before baking | After baking |
| (4) | 119° C. | 119° C. |
| (5) | 200° C. | 200° C. |
| (6) | 218° C. | 218° C. |

EXAMPLE FOR COMPARISON 5

With the use of a conventional vacuum depositing apparatus, the compounds (4) to (6) as described above were placed as the materials to be vapor-deposited in an amount of 0.2 gr., respectively, into three spouting cells and the melting point was measured before and after the baking operation. The baking conditions were the same as those in Example 5: vacuum of about $10^{-8}$ Torr and temperature of 250° C. for eight hours. Under these conditions, the materials to be vapor-deposited in the spouting cells volatilized and nothing remained.

The vacuum depositing apparatus of the present invention has been described in detail by means of examples. The apparatus of the present invention may be applied in various varieties. It is possible, for example, to use the apparatus in such variations as to permit application to vapor depositing operations such as vacuum evaporation, thermal decomposition plasma evaporation and sputtering. The scope of the present invention covers all the scope as claimed in the claims and equivalent scope.

What is claimed is:

1. A vacuum depositing apparatus, comprising a vacuum vessel containing a substrate used for the purpose of applying a vapor-deposited film thereupon by means of vapor deposition; a sputtering cell charged with a material to be vapor-deposited; a collimator containing long channels to impart directivity to the evaporated material to be vapor deposited from the spouting cell to the substrate, thereby serving a rectifying function between said spouting cell and said substrate, said collimator being installed between said substrate and said spouting cell along a straight line connecting the center of said substrate with the center of said spouting cell for the purpose of preventing impurities from contaminating the vapor-deposited film, wherein said collimator is maintained at a temperature lower than that of said spouting cell or that of said substrate.

2. The vacuum depositing apparatus as claimed in claim 1: said material to be deposited forms a molecular beam flow from said spouting cell toward said substrate.

3. A vacuum depositing apparatus, comprising a vacuum vessel containing a substrate used for the purpose of applying a vapor-deposited film thereupon by means of vapor-deposition; one or more spouting cells charged with a material to be vapor-deposited, each spouting cell including one or more separation mechanisms which make it possible to charge the spouting cell with said material under substantially atmospheric pressure, while said substrate is kept under vacuum.

4. The vacuum depositing apparatus as claimed in claim 3 wherein said separation mechanism(s) are vacuum valves provided between said substrate and said spouting cell.

5. The vacuum depositing apparatus as claimed in claim 3 wherein said material to be deposited forms a molecular beam flow from said spouting cell toward said substrate.

6. The vacuum depositing apparatus as claimed in claim 3, wherein as the mechanism for preventing impurities from mixing into the vapor-deposited film, said one or more spouting cells each contain a specimen container provided with unsealing means operable under vacuum.

7. The vacuum depositing apparatus as claimed in claim 6, wherein said specimen container is a tightly enclosed container with the material to be vapor-deposited provided therein.

8. The vacuum depositing apparatus as claimed in claim 6 or 7, wherein all or part of the specimen container containing said material to be vapor deposited comprises glass or plastics.

9. The vacuum depositing apparatus as claimed in claim 6 or 7, wherein said material to be vapor deposited forms a molecular beam flow from said spouting cell toward said substrate.

10. The vacuum depositing apparatus as claimed in claim 8, wherein said material to be vapor deposited forms a molecular beam flow from said spouting cell toward said substrate.

* * * * *